United States Patent [19]

Day

[11] 4,062,105

[45] Dec. 13, 1977

[54] METHOD FOR FABRICATING FERROELECTRIC ULTRASONIC TRANSDUCERS

[75] Inventor: Robert A. Day, Livermore, Calif.

[73] Assignee: The United States of America as represented by the Secretary of the Navy, Washington, D.C.

[21] Appl. No.: 752,571

[22] Filed: Dec. 20, 1976

[51] Int. Cl.² .......................................... H04R 31/00
[52] U.S. Cl. .................................. 29/594; 29/25.35; 219/121 EM
[58] Field of Search ............... 29/594, 25.35; 361/233; 179/111 E; 219/121 EM, 121 EB, 121 LM

[56] References Cited

U.S. PATENT DOCUMENTS

| 3,858,307 | 1/1975 | Yoshimura | 29/594 |
| 3,945,099 | 3/1976 | Kansy | 29/25.35 |

*Primary Examiner*—Carl E. Hall
*Attorney, Agent, or Firm*—R. S. Sciascia; Charles D. B. Curry; Francis I. Gray

[57] ABSTRACT

A method for fabricating ferroelectric ultrasonic transducers by directing a beam of electrons at a disk of ferroelectric material to produce a thin plate throughout which the Curie temperature is exceeded, and by applying a high DC Voltage across the faces of the disk while the Curie temperature is exceeded to polarize the thin plate.

2 Claims, 2 Drawing Figures

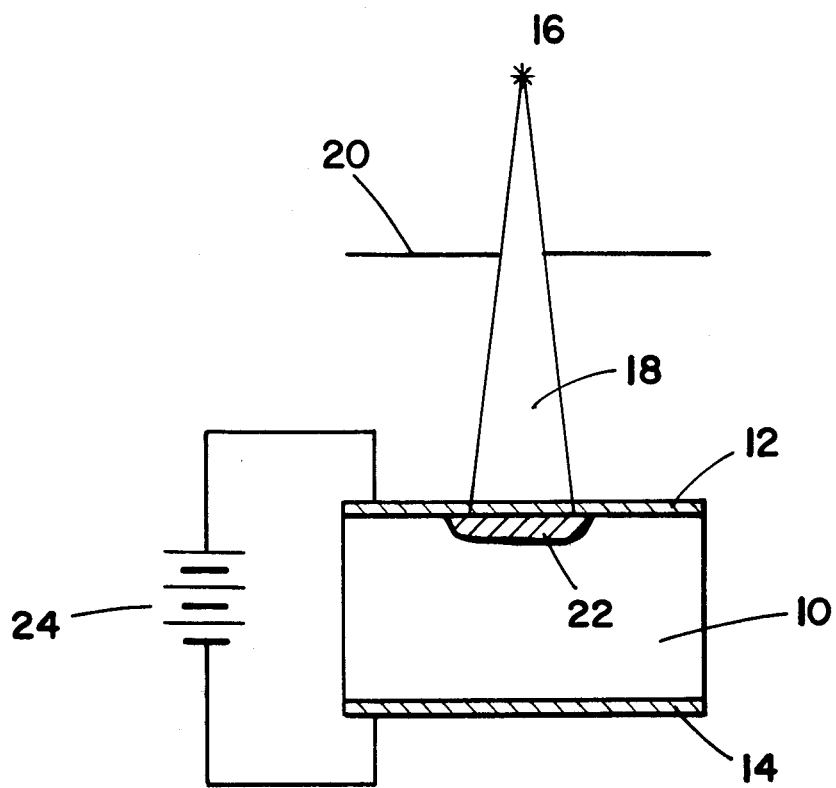
FIG_1
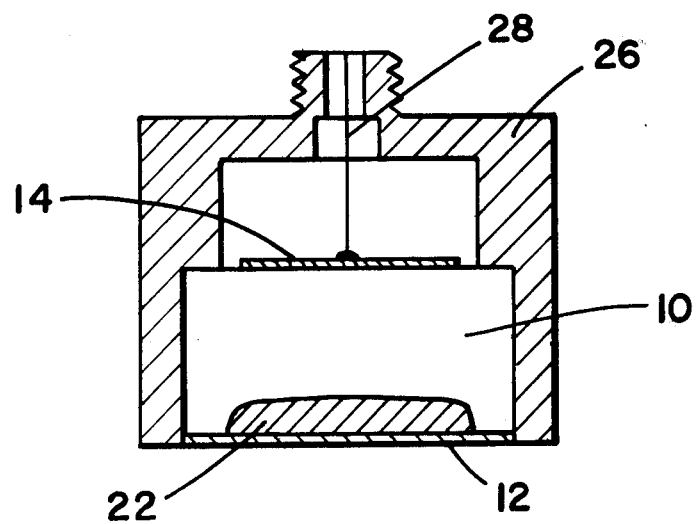
FIG_2

METHOD FOR FABRICATING FERROELECTRIC ULTRASONIC TRANSDUCERS

BACKGROUND OF THE INVENTION

1. Field of the Invention

The present invention relates to a method of fabricating acoustic transducers, and more particularly to a method of fabricating ferroelectric ultrasonic transducers by using an electton beam.

2. Description of the Prior Art

Ferroelectric acoustic transducers are currently fabricated by placing a thin disk of the ferroelectric material in an oven at the Curie temperature of the ferroelectric. A high DC voltage is imposed on the disk to polarize it and make it acoustically active in a manner similar to piezoelectric crystals. The thickness of the disk determines the resonant frequency of the transducer and damping is determined by a backing member.

The backing member must be impedance matched as closely as possible to the ferroelectric disk to minimize the amplitude of back reflected waves. These back reflected waves result in decreased sensitivity.

For high frequencies (greater than 10 megahertz) a very thin disk is required. However, the ferroelectric materials are very brittle and the thicknesses required to reach these frequencies are very difficult to achieve in useful diameters.

SUMMARY OF THE INVENTION

Accordingly, the present invention provides a method for fabricating ferroelectric ultrasonic transducers which uses the bulk ferroelectric material as the backing member while a plate area within the material serves as the transducer. A ferroelectric disk is placed in a vacuum and a beam of electrons is directed at the disk. An aperture confines the beam to a desired diameter, and the depth of heating is controlled by the energy of the beam and the time of exposure to the beam to produce a plate in which the Curie temperature is everywhere exceeded.

A high DC voltage is applied across the faces of the disk while the Curie temperature of the plate is exceeded to polarize the plate, which will then act as an acoustic generator and receiver.

STATEMENT OF THE OBJECTS OF THE INVENTION

Therefore, it is an object of the present invention to provide a method for fabricating ferroelectric ultrasonic transducers which polarizes ferroelectric solids to a specified depth without polarizing the bulk material.

Another object of the present invention is to provide a method for fabricating ferroelectric ultrasonic transducers which do not create back reflected waves.

Yet another object of the present invention is to provide a method for fabricating a ferroelectric ultrasonic transducer which is not brittle.

Other objects, advantages and novel features of the invention will become apparent from the following detailed description of the invention when considered in conjunction with the accompanying drawing wherein:

BRIEF DESCRIPTION OF THE DRAWING

FIG. 1 is a diagrammatic view of the method of the present invention.

FIG. 2 is a sectional view of the transducer fabricated by the method of the present invention.

DESCRIPTION OF THE PREFERRED EMBODIMENT

Referring now to FIG. 1 a ferroelectric disk 10 or other flat shape is fabricated with flat parallel faces. These faces are provided with conductive surfaces 12, 14 which are electrically insulated from each other. The conductive surfaces 12, 14 are a thin conductive layer from 0.02 to 0.1 microns thick of an electrical conducting material such as aluminum, gold, platinum, silver, etc. The disk 10 is placed in a vacuum and a source of electrons 16 provides a beam of electrons 18 which is directed at the disk. An aperture 20 confines the electron beam 18 to a desired diameter.

As the electrons from the electron beam 18 are absorbed into the surface of the ferroelectric disk 10, the disk surface heats. The depth to which the ferroelectric disk 10 is heated is controlled by the energy of the electron beam 18 and the time of exposure to the ferroelectric material. The plate 22 is defined by the region within the disk in which the Curie temperature of the ferroelectric material is everywhere exceeded. The conductive surface 12 facing the source of electrons 16 is maintained at a high positive potential relative to the source of electrons to control the depth of the plate 22, and thereby determine the operating frequency of the finished transducer which is inversely proportional to the thickness, or depth, of the plate. A high DC voltage source 24 imposes a potential difference between the conductive surfaces 12, 14 such that an electric field of at least 10 million volts per meter ($10^7$ vdc/m) exists in the ferroelectric disk 10. The high potential difference between the conductive surfaces 12, 14 is maintained while the plate 22 is maintained above the Curie temperature, and results in polarizing the plate, i.e., enabling the plate to act as an acoustic generator and receiver.

To complete the transducer no further preparation is required except for enclosure in a case 26 and appropriate wiring 28 attached to the conductive surface 14 opposite the plate 22, as shown in FIG. 2.

The surface of the ferroelectric material exposed to the electron beam 18 may be curved rather than flat to achieve focusing of the sound, the curvature being determined by the conventional criteria used for shaped transducer elements.

Thus, the transducer fabricated according to the present invention eliminates the conventional backing member since the buld ferroelectric material provides an exact imedance match which eliminates back reflected waves. The transducer also eliminates the requirement of a very thin, brittle ferroelectric disk for high frequencies since the disk may have an arbitrary thickness, the frequency being determined by the thickness, or depth, of the plate.

I claim:

1. A method for fabricating ferroelectric ultrasonic transducers comprising the steps of:
   a. placing a ferroelectric material in a vacuum, said ferroelectric material having opposing faces with thin electrically conductive surfaces thereon, which surfaces are electrically insulated from each other;
   b. directing a beam of electrons at one face of said ferroelectric material to produce a plate in said ferroelectric material, said plate being defined as the region within said ferroelectric material in which the Curie temperature is everywhere exceeded; and c. imposing a high potential difference between said conductive surfaces while the Curie temperature of said plate is exceeded to polarize said plate.

2. A method for fabricating ferroelectric ultrasonic transducers as recited in claim 1 further comprising the step of applying a high positive potential relative to the source of said beam of electrons to the face upon which said beam of electrons impinges to control the depth of said plate.

* * * * *